(12) United States Patent
Wang et al.

(10) Patent No.: US 12,193,274 B2
(45) Date of Patent: Jan. 7, 2025

(54) DISPLAY SUBSTRATE, DISPLAY DEVICE, AND MANUFACTURING METHOD THEREOF

(71) Applicant: BOE TECHNOLOGY GROUP CO., LTD., Beijing (CN)

(72) Inventors: Guoying Wang, Beijing (CN); Pan Xu, Beijing (CN); Xing Zhang, Beijing (CN); Ying Han, Beijing (CN); Zhan Gao, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 521 days.

(21) Appl. No.: 17/512,380

(22) Filed: Oct. 27, 2021

(65) Prior Publication Data

US 2022/0320204 A1  Oct. 6, 2022

(30) Foreign Application Priority Data

Mar. 31, 2021 (CN) .......................... 202110350226.4

(51) Int. Cl.
| | |
|---|---|
| H10K 59/122 | (2023.01) |
| H01L 27/12 | (2006.01) |
| H10K 50/824 | (2023.01) |
| H10K 59/12 | (2023.01) |
| H10K 59/121 | (2023.01) |
| H10K 59/124 | (2023.01) |
| H10K 59/38 | (2023.01) |
| H10K 71/00 | (2023.01) |

(52) U.S. Cl.
CPC ......... *H10K 59/122* (2023.02); *H10K 50/824* (2023.02); *H10K 59/1213* (2023.02); *H10K 59/124* (2023.02); *H10K 59/38* (2023.02); *H10K 71/00* (2023.02); *H01L 27/1214* (2013.01); *H10K 59/1201* (2023.02)

(58) Field of Classification Search
None
See application file for complete search history.

(56) References Cited

U.S. PATENT DOCUMENTS

| | | | |
|---|---|---|---|
| 2016/0181566 A1 | 6/2016 | Wang | |
| 2019/0115561 A1 | 4/2019 | Tang et al. | |

(Continued)

FOREIGN PATENT DOCUMENTS

| | | |
|---|---|---|
| CN | 103972270 A | 8/2014 |
| CN | 109728054 A | 5/2019 |

(Continued)

OTHER PUBLICATIONS

First Office Action for corresponding CN application No. 202110350226.4 mailed Aug. 2, 2022 with translation, 22 pages.

*Primary Examiner* — Michael Lebentritt
(74) *Attorney, Agent, or Firm* — Myers Bigel, P.A.

(57) ABSTRACT

The present disclosure provides a display substrate, a display device and a manufacturing method thereof. The display substrate includes a first substrate, a pixel defining layer on the first substrate and including a plurality of sub-pixel openings, and at least one recess on a side of the display substrate away from the first substrate. An orthographic projection of the at least one recess on the first substrate and orthographic projections of the plurality of sub-pixel openings on the first substrate do not overlap.

19 Claims, 4 Drawing Sheets

(56) References Cited

U.S. PATENT DOCUMENTS

| | | | |
|---|---|---|---|
| 2019/0173047 A1 | 6/2019 | Sun et al. | |
| 2021/0193763 A1* | 6/2021 | Sun | H10K 59/124 |
| 2022/0123091 A1* | 4/2022 | Zhu | H10K 71/00 |
| 2022/0246674 A1* | 8/2022 | Lin | H01L 27/156 |

FOREIGN PATENT DOCUMENTS

| | | | |
|---|---|---|---|
| CN | 109791942 A | | 5/2019 |
| CN | 111710694 A | | 9/2020 |
| CN | 113644220 A | * | 11/2021 |
| CN | 113991041 A | * | 1/2022 |
| CN | 117295360 A | * | 12/2023 |

* cited by examiner

DISPLAY SUBSTRATE, DISPLAY DEVICE, AND MANUFACTURING METHOD THEREOF

RELATED APPLICATION

This application claims the priority of the Chinese Patent Application No. 202110350226.4 filed on Mar. 31, 2021, the entire disclosure of which is incorporated herein by reference.

TECHNICAL FIELD

The present disclosure relates to the field of display technology, and in particular, to a display substrate, a display device and a manufacturing method thereof.

BACKGROUND

According to different light emission directions from the device, organic light-emitting diode (OLED) display devices are mainly divided into two different structural types: one is a bottom emission display device, and the other is a top emission display device. In a top emission display device, light is emitted from the top of the display device without being affected by the thin film transistor (TFT) below, and the aperture ratio can theoretically reach 100%, which can significantly improve the utilization efficiency of light, and facilitate the integration of devices and circuits. At present, a top emission display device can be realized by assembling a display substrate and a color filter substrate.

SUMMARY

According to an aspect of the present disclosure, a display substrate is provided. The display substrate comprises a first substrate, a pixel defining layer on the first substrate and comprising a plurality of sub-pixel openings, and at least one recess on a side of the display substrate away from the first substrate. An orthographic projection of the at least one recess on the first substrate and orthographic projections of the plurality of sub-pixel openings on the first substrate do not overlap.

In some embodiments, the display substrate further comprises; an insulating layer between the first substrate and the pixel defining layer, the insulating layer comprising at least one groove; a light-emitting layer on a side of the pixel defining layer away from the first substrate and at least in the plurality of sub-pixel openings; and a cathode on a side of the light-emitting layer away from the first substrate, and covering a surface of the light-emitting layer away from the first substrate and a surface of the pixel defining layer away from the first substrate and not covered by the light-emitting layer. At least a part of the pixel defining layer and a part of the cathode are stacked in the groove to form the recess.

In some embodiments, a part of the pixel defining layer, a part of the light-emitting layer, and a part of the cathode are stacked in the groove to form the recess.

In some embodiments, the display substrate further comprises: a circuit structure layer between the first substrate and the insulating layer, and an anode between the insulating layer and the light-emitting layer and at least in the plurality of sub-pixel openings.

In some embodiments, the insulating layer comprises a passivation layer and a first flat layer that are stacked, the passivation layer is between the circuit structure layer and the first flat layer, and the bottom of the groove is in the first flat layer, or at an interface between the first flat layer and the passivation layer, or in the passivation layer.

In some embodiments, the anode is electrically connected to a thin film transistor in the circuit structure layer through a via hole penetrating the groove.

In some embodiments, the anode covers a part of the bottom of the groove.

In some embodiments, an orthographic projection of the recess on the first substrate and an orthographic projection of a thin film transistor in the circuit structure layer on the first substrate at least partially overlap.

In some embodiments, the display substrate comprises a plurality of recesses, and the plurality of recesses are approximately uniformly distributed on the display substrate.

In some embodiments, one recess is arranged between every 1-8 sub-pixel openings.

According to another aspect of the present disclosure, a display device is provided. The display device comprises the display substrate described in any of the foregoing embodiments and a color filter substrate opposite to the display substrate, the color filter substrate comprising at least one spacer protruding toward the display substrate. The at least one spacer corresponds to the at least one recess in a one-to-one correspondence, and at least a part of one of the at least one spacer is received in a corresponding one of the at least one recess.

In some embodiments, the color filter substrate further comprises an auxiliary electrode between a protruding end of the spacer and the recess, and the auxiliary electrode is electrically connected to a cathode of the display substrate.

In some embodiments, a distance between the auxiliary electrode and the first substrate is a first distance, a distance between a portion of a light-emitting layer of the display substrate in the sub-pixel openings and the first substrate is a second distance, and the first distance is smaller than the second distance.

In some embodiments, a material of the auxiliary electrode is at least one selected from a group consisting of Mo, Al, Ti, Au, Cu, Hf, Ta, Nd and alloys thereof.

In some embodiments, the color filter substrate further comprises: a second substrate; a filter layer on the second substrate; and a second flat layer on a side of the filter layer away from the second substrate. The spacer is on a side of the second flat layer away from the second substrate and is integrally formed with the second flat layer.

In some embodiments, a material of the second flat layer and the spacer is at least one selected from a group consisting of resin, spin on glass, and benzocyclobutene.

According to still another aspect of the present disclosure, a method for manufacturing the display device described in any of the foregoing embodiments is provided. The method comprises: forming the display substrate comprising the at least one recess; forming the color filter substrate comprising the at least one spacer, the at least one spacer corresponding to the at least one recess in a one-to-one correspondence; and assembling the display substrate and the color filter substrate to make at least a part of one of the at least one spacer to be received in a corresponding one of the at least one recess In some embodiments, the forming the display substrate comprises: sequentially forming a circuit structure layer and an insulating material layer on the first substrate; patterning the insulating material layer to form an insulating layer comprising at least one groove; and sequentially forming an anode, a pixel defining layer, a light-emitting layer, and a cathode on a side of the insulating layer away from the first substrate, so that at least a part of the pixel defining layer and a part of the cathode are stacked in the groove to form the recess.

In some embodiments, the forming the color filter substrate comprises: forming a filter layer on the second substrate; and applying a flat layer on a side of the filter layer away from the second substrate, and patterning the flat layer to simultaneously form a second flat layer and the spacer.

In some embodiments, the forming the color filter substrate further comprises: forming an auxiliary electrode at a protruding end of the spacer on a side away from the second substrate.

BRIEF DESCRIPTION OF THE DRAWINGS

In order to more clearly describe the technical solutions in the embodiments of the present disclosure, the drawings in the embodiments will be briefly introduced in the following. Obviously, the drawings described in the following are only some embodiments of the present disclosure. For those of ordinary skill in the art, other drawings can also be obtained based on these drawings without creative work.

DETAILED DESCRIPTION OF THE DISCLOSURE

The embodiments of the present disclosure are described in detail below. The embodiments described below are exemplary, and are only used to explain the present disclosure, and should not be construed as limiting the present disclosure. Where specific techniques or conditions are not indicated in the embodiments, the procedures shall be carried out in accordance with the techniques or conditions described in the literature in the field or in accordance with the product specification. The reagents or instruments used without the manufacturer's indication are all conventional products that can be purchased commercially.

In one aspect of the present disclosure, a display substrate is provided. According to an embodiment of the present disclosure, referring to FIG. 1, the display substrate 100 comprises: a first substrate 11; a pixel defining layer 20 which is located on the first substrate 11 and comprises a plurality of sub-pixel openings 21; and at least one recess 30 located on a side of the display substrate 100 away from the first substrate 11. An orthographic projection of the at least one recess 30 on the first substrate 11 and orthographic projections of the plurality of sub-pixel openings 21 on the first substrate 11 do not overlap. Due to the recess 30, when the display substrate 100 is assembled into a display device, the recess 30 can accommodate the spacers protruding on the color filter substrate. Compared to accommodating the spacers in the film layer parallel to the first substrate 11, the display substrate 100 provided by the embodiments of the present disclosure can greatly reduce the thickness (i.e., the cell thickness) of the display device, thereby reducing the light-emitting path of the light-emitting element, improving the efficiency of light emitted by the light-emitting element, and prolonging the life of the light-emitting element.

According to the embodiments of the present disclosure, the specific method of forming the recess 30 is not particularly limited. Specifically, the recess 30 can be formed in the display substrate 100 by forming a groove in a certain layer or layers in the display substrate 100, and the position of the layer(s) forming the groove in the display substrate 100 is not particularly required. It can be located on both sides of the display substrate 100 or in the middle of the display substrate 100. In some embodiments, a groove may be formed in the insulating layer of the display substrate 100. Specifically, referring to FIG. 1, a base 10 comprises: the first substrate 11; a circuit structure layer 12 on the first substrate 11; an insulating layer 13 which is provided on a side of the circuit structure layer 12 away from the first substrate 11 and comprises at least one groove 14; an anode 15 on a side of the insulating layer 13 away from the first substrate 11, and an orthographic projection of the anode 15 on the first substrate 11 covers the orthographic projections of the sub-pixel openings 21 on the first substrate 11, that is, the anode 15 is located at least in the plurality of sub-pixel openings 21; a light-emitting layer 16 on a side of the pixel defining layer 20 away from the first substrate 11, and an orthographic projection of the light-emitting layer 16 on the first substrate 11 covers the orthographic projections of the sub-pixel openings 21 on the first substrate 11, that is, the light-emitting layer 16 is located at least in the plurality of sub-pixel openings 21; and a cathode 17 which is arranged on a side of the light-emitting layer 16 away from the first substrate 11, and covers a surface of the light-emitting layer 16 away from the first substrate 11 and a surface of the pixel defining layer 20 away from the first substrate 11 and not covered by the light-emitting layer 16. In some embodiments, a part of the pixel defining layer 20 and a part of the cathode 17 are stacked in the groove 14 to form the recess 30. In an alternative embodiment, a part of the pixel defining layer 20, a part of the light-emitting layer 16 and a part of the cathode 17 are stacked in the groove 14 to form the recess 30. Therefore, it has no influence on other structures of the display substrate 100, and the process of forming the groove 14 is simple and has high compatibility with existing equipment and processes.

Figure 1:
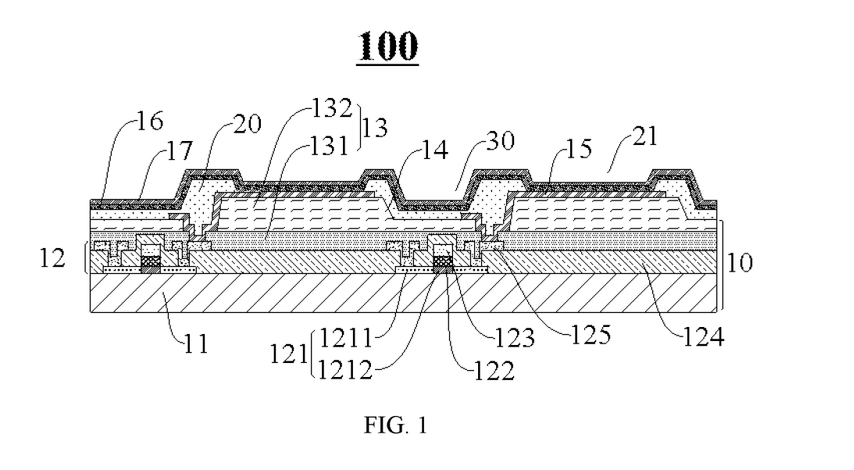
FIG. 1 is a schematic diagram of the structure of a display substrate according to an embodiment of the present disclosure.

It should be noted that the light-emitting layer 16 may or may not be provided on the inner wall of the groove 14, that is, the pixel defining layer 20, the light-emitting layer 16 and the cathode 17 may be stacked on the inner wall of the groove 14, or the pixel defining layer 20 and the cathode 17 are stacked on the inner wall of the groove 14.

According to the embodiment of the present disclosure, the specific type of the first substrate 11 is not particularly limited, and can be flexibly selected according to actual needs. In some specific embodiments, the first substrate 11 may be glass, polymer, or the like.

According to an embodiment of the present disclosure, a circuit for driving the display device for display may be provided in the circuit structure layer 12, and the specific circuit structure is not particularly limited, as long as the driving display can be effectively realized. In some specific embodiments, a thin film transistor (TFT) array may be provided in the circuit structure layer 12. Specifically, each TFT may comprise an active layer 121 (the active layer 121 comprises a conductor portion 1211 and a semiconductor portion 1212), a gate insulating layer 122, a gate electrode 123, an interlayer insulating layer 124, and a source and drain electrode 125. It can be understood that the TFT structure here is only an exemplary description, and is not a limitation to the embodiments of the present disclosure. For example, the TFT may also be a bottom gate structure, a back channel etch structure (BCE), an etch stop layer structure (ESL), etc., which will not be repeated here.

Specifically, the material of the insulating layer (the gate insulating layer 122 and the interlayer insulating layer 124) in the circuit structure layer 12 may be silicon oxide, silicon nitride, etc., which has a good insulating effect. The material of the active layer 121 may be an oxide semiconductor material (such as amorphous indium gallium zinc oxide (a-IGZO), nitrogen-doped zinc oxide (ZnON), indium tin-doped zinc oxide (IZTO), silicon material (such as low temperature polysilicon, amorphous silicon) and organic materials (such as hexathiophene and polythiophene), etc., which can be selected according to specific requirements. The material of the gate electrode 123 and the source and drain electrodes 125 can be metals or alloys, for example, Ag, Cu, Al, Mo, etc., or multilayer metals such as Mo/Cu/Mo, etc., or alloy materials of the above metals, such as AlNd, MoNb etc.

According to an embodiment of the present disclosure, the insulating layer 13 may have a single-layer structure or a multilayer structure. In some embodiments, referring to FIG. 1, the insulating layer 13 comprises a passivation layer 131 and a first flat layer 132 that are stacked, the passivation layer 131 is disposed close to the circuit structure layer 12, and the bottom of the groove 14 may be located in the first flat layer 132 (refer to the display substrate 100 of FIG. 1), or may be located at an interface between the first planarization layer 132 and the passivation layer 131 (refer to the display substrate 2000 of FIG. 2), or may be located in the passivation layer 131 (refer to FIG. 3 of the display substrate 300). Disposing a part of the pixel defining layer 20 and the cathode 17 (and optionally the light-emitting layer 16) in the groove 14 to form the recess 30, in this way, the recess 30 can be formed by using the existing structure in the display substrate 100, which facilitates the simplification of the structure, and has no influence on other structures in the display substrate 100.

The material of the insulating layer 13 is not particularly limited. In some embodiments, the material of the passivation layer 131 may be silicon oxide, silicon nitride, etc., and the material of the first flat layer 132 may be resin, such as polymethylmethacrylate, polycarbonate, polyimide and so on.

Figure 2:
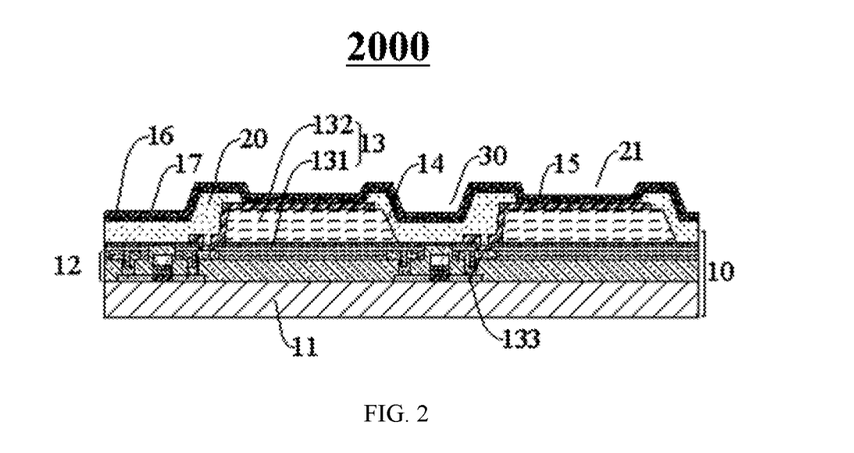
FIG. 2 is a schematic diagram of the structure of a display substrate according to another embodiment of the present disclosure.

According to an embodiment of the present disclosure, referring to FIG. 2, the anode 15 is electrically connected to the thin film transistor in the circuit structure layer 12 through a via hole 133 (specifically, the anode 15 can be electrically connected to the source and drain electrode 125 in the thin film transistor), and the via hole 133 penetrates the groove 14. Specifically, the via hole 133 may be formed at the bottom of the groove 14. Further, referring to FIG. 2, the anode 15 may cover a part of the bottom of the groove 14. As a result, the thickness of the film that needs to be penetrated to form the via hole 133 is thinner, the processing time can be shortened, the cost is reduced, and the structure is more compact, which is beneficial for the improvement of the resolution of the display device.

Specifically, the material of the anode 15 can be metal, alloy or transparent conductive oxide, which can be specifically selected according to actual needs. In some embodiments, the display substrate 100 is used in a bottom emission display device, and the anode 15 needs a certain transmittance to ensure that light is emitted for display. In this case, the material of the anode 15 can be thinner metal, alloy or transparent conductive oxide. In an alternative embodiment, the display substrate 100 is used in a top emission display device, and the material of the anode 15 is not particularly limited. In this case, a metal or an alloy can be used for better conductivity, the metal or alloy includes but is not limited to Ag, Cu, Al, Mo, multilayer metals such as Mo/Cu/Mo, alloy materials of the above metals such as AlNd, MoNb, a stack structure (such as Mo/AlNd/ITO) formed by metal and transparent conductive oxide (such as ITO (indium tin oxide), AZO (aluminum-doped zinc oxide)).

According to the embodiments of the present disclosure, according to the needs of different display colors, the light-emitting layer 16 may be a continuous whole-layer structure (in the drawings herein, the light-emitting layer 16 is a continuous whole-layer structure as an example), or may be a plurality of light-emitting sub-layers arranged at intervals, and each light-emitting sub-layer is arranged corresponding to one sub-pixel opening 21. Specifically, when the display device is a monochrome display, the light-emitting layer 16 may be a whole-layer structure, or may be a plurality of light-emitting sub-layers arranged at intervals; when the display device is a color display, it is necessary to provide the light-emitting layer 16 with different colors, and the light-emitting layer 16 is a plurality of light-emitting sub-layers arranged at intervals. It should be noted here that when the light-emitting layer 16 has a whole-layer structure, the pixel defining layer 20, the light-emitting layer 16 and the cathode 17 are stacked in the groove 14; and when the light-emitting layer 16 is a plurality of light-emitting sub-layers arranged at intervals, all the light-emitting layer 16, a part of the light-emitting layer 16, or none of the light-emitting layer 16 may be provided in the groove 14.

According to the embodiment of the present disclosure, the cathode 17 may have a whole-layer structure, thus, the display effect is not affected, and the preparation is convenient. The material of the cathode 17 may be metal, alloy or transparent conductive oxide. Specifically, when the display substrate is used in a bottom emission display device, there is no requirement for the transmittance of the cathode 17, and a metal or alloy with better conductivity can be selected. When the display substrate is used in a top emission display device, the transmittance of the cathode 17 is required to be high, and transparent conductive oxide materials (such as AZO, IZO, etc.) and thinner metal materials selected from at least one of Mg, Ag, Ca, Sm, Al and Ba (e.g. composite materials such as Mg/Ag, Ca/Ag, Sm/Ag, Al/Ag, Ba/Ag) are needed.

Figure 3:
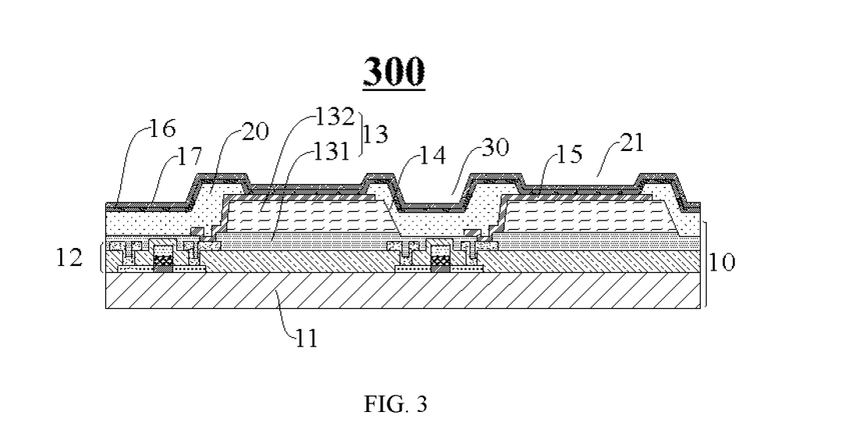
FIG. 3 is a schematic diagram of the structure of a display substrate according to still another embodiment of the present disclosure.

According to an embodiment of the present disclosure, referring to FIGS. 1 to 3, in the thickness direction of the display substrate, that is, in the direction perpendicular to the first substrate 11, the orthographic projection of the recess 30 on the first substrate 11 at least partially overlaps with the orthographic projection of the thin film transistor in the circuit structure layer 12 on the first substrate 11. In this way, the recess 30 is disposed in the non-aperture area of the display substrate, and will not affect the light emission of the light-emitting element, which can effectively improve the aperture ratio and light emission efficiency, which is beneficial to improve the resolution and display quality. It should be noted that the "non-open area of the display substrate" refers to the area in the display substrate through which the light emitted by the light-emitting element cannot transmit, for example, the position where the thin film transistors and storage capacitors are located, the "open area of the display substrate" refers to the area in the display substrate through which the light emitted by the light-emitting element can effectively transmit. The ratio of the effective light-transmitting area to the total area of the display substrate is the aperture ratio of the display substrate.

According to an embodiment of the present disclosure, the number of the recesses 30 may be multiple, and the multiple recesses 30 are substantially uniformly distributed on the display substrate. In some embodiments, one to eight (specifically, one, two, three, four, five, six, seven, or eight) sub-pixel openings 21 are correspondingly provided with one recess 30. In other words, one recess 30 is arranged between every 1 to 8 sub-pixel openings 21. Therefore, when the display substrate and the color filter substrate are pressed together, the display substrate can be better matched with the spacer. The substantially uniform distribution of the recesses 30 can make the stress uniformly distributed, which is beneficial to improve the stability and use effect of the display device.

Figure 4:
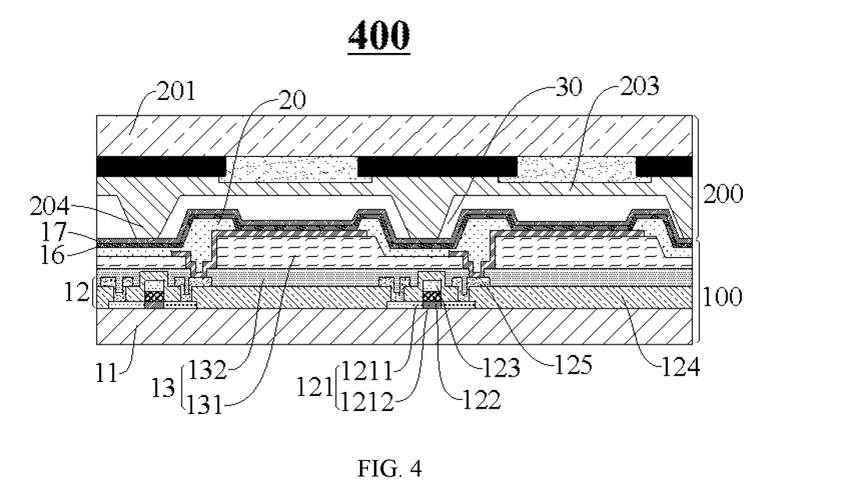
FIG. 4 is a schematic diagram of the structure of a display device according to an embodiment of the present disclosure.

According to another aspect of the present disclosure, a display device is provided. Referring to FIG. 4, the display device 400 comprises: the display substrate 100, 2000, 300 described in any of the previous embodiments (FIG. 4 takes the display substrate 100 as an example); and a color filter substrate 200 opposite to the display substrate 100. The color filter substrate 200 comprises at least one spacer 204 protruding toward the display substrate 100, the at least one spacer 204 corresponds to the at least one recess 30 in a one-to-one correspondence, and at least a part of each spacer 204 is received in a corresponding recess 30. By receiving the protruding spacers 204 in the recesses 30, the distance between the display substrate 100 and the color filter substrate 200 can be reduced, thereby helping to reduce the thickness of the display device 400, thereby reducing the distance between the light-emitting layer 106 and the light-emitting surface of the display device 400, shortening the light-emitting path of the light-emitting layer 106, improving the light-emitting efficiency, and prolonging the lifetime.

Figure 5:
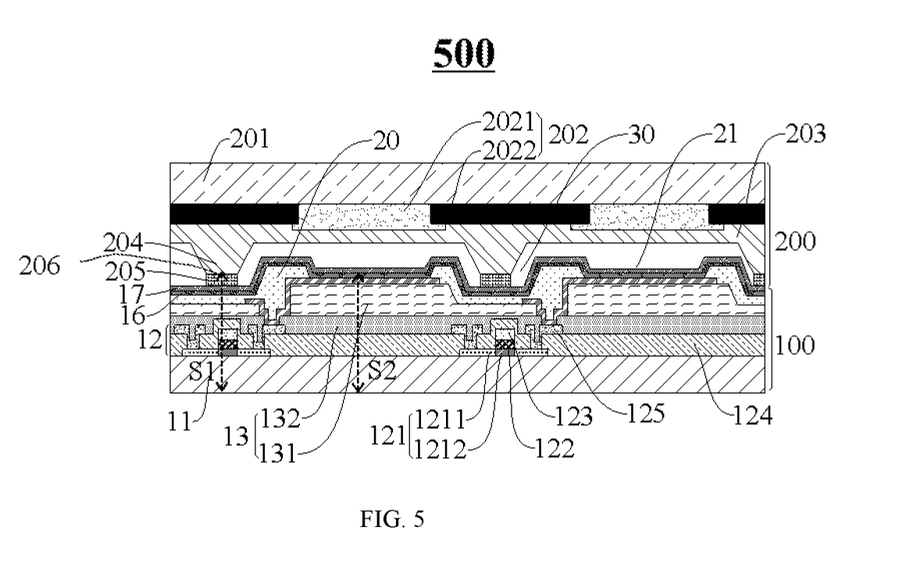
FIG. 5 is a schematic diagram of the structure of a display device according to another embodiment of the present disclosure.

According to an embodiment of the present disclosure, referring to the display device 500 illustrated in FIG. 5, in some embodiments, an auxiliary electrode 205 is provided between the protruding end 206 of the spacer 204 and the recess 30. The auxiliary electrode 205 is electrically connected to the cathode 17 of the display substrate 100. As a result, the resistance of the cathode 17 can be greatly reduced. Especially when the display device 500 is a top emission display device, the cathode 17 is generally formed of a transparent conductive oxide and has a relatively high resistance in order to ensure the light transmission effect. In this case, the arrangement of the auxiliary electrode 205 can greatly reduce the resistance of the cathode 17 and improve the use effect of the display device 500.

Continuing to refer to FIG. 5, the distance between the auxiliary electrode 205 and the first substrate 101 is a first distance S1, and the distance between the portion of the light-emitting layer 16 of the display substrate 100 located in the sub-pixel openings 21 and the first substrate 11 is a second distance S2. The first distance S1 is smaller than the second distance S2, that is, the auxiliary electrode 205 is disposed under the portion of the light-emitting layer 16 located in the sub-pixel openings 21. As a result, the light emitted from the light-emitting layer 16 is prevented from being reflected by the auxiliary electrode 205, and the pixel light leakage and the TFT being irradiated by the internal reflected light of the display device 500 are avoided, and the stability of the display device 500 can be effectively improved.

According to an embodiment of the present disclosure, the material of the auxiliary electrode 205 may comprise at least one of Mo, Al, Ti, Au, Cu, Hf, Ta, Nd, and alloys thereof. Specifically, the alloy may be AlNd, MoNb, and the like. Further, the auxiliary electrode 205 may have a single-layer structure or a multilayer structure, and specifically may be a multilayer metal, such as MoNb/Cu/MoNb, AlNd/Mo/AlNd, and the like.

According to an embodiment of the present disclosure, referring to FIG. 5, the color filter substrate 200 may further include: a second substrate 201; a filter layer 202 which is provided on the second substrate 201 and comprises a color filter 2021 and a black matrix 2022; a second flat layer 203 which is provided on a side of the filter layer 202 away from the second substrate 201. The spacer 204 is located on a side of the second flat layer 203 away from the second substrate 201 and is integrally formed with the second flat layer 203. In other words, the spacer 204 and the second flat layer 203 can be formed at the same time by patterning the same film layer. Therefore, the display device 500 is easy to prepare, the spacer 204 does not fall off, and the stability of the display device 500 is better.

In some embodiments, the material of the second flat layer 203 and the spacer 204 may comprise at least one of resin, spin on glass (SOG), and benzocyclobutene (BCB).

According to another aspect of the present disclosure, there is provided a method of preparing the display device described in any of the foregoing embodiments. The method can comprise the following steps:

S10: forming a display substrate comprising at least one recess.

Figure 6:
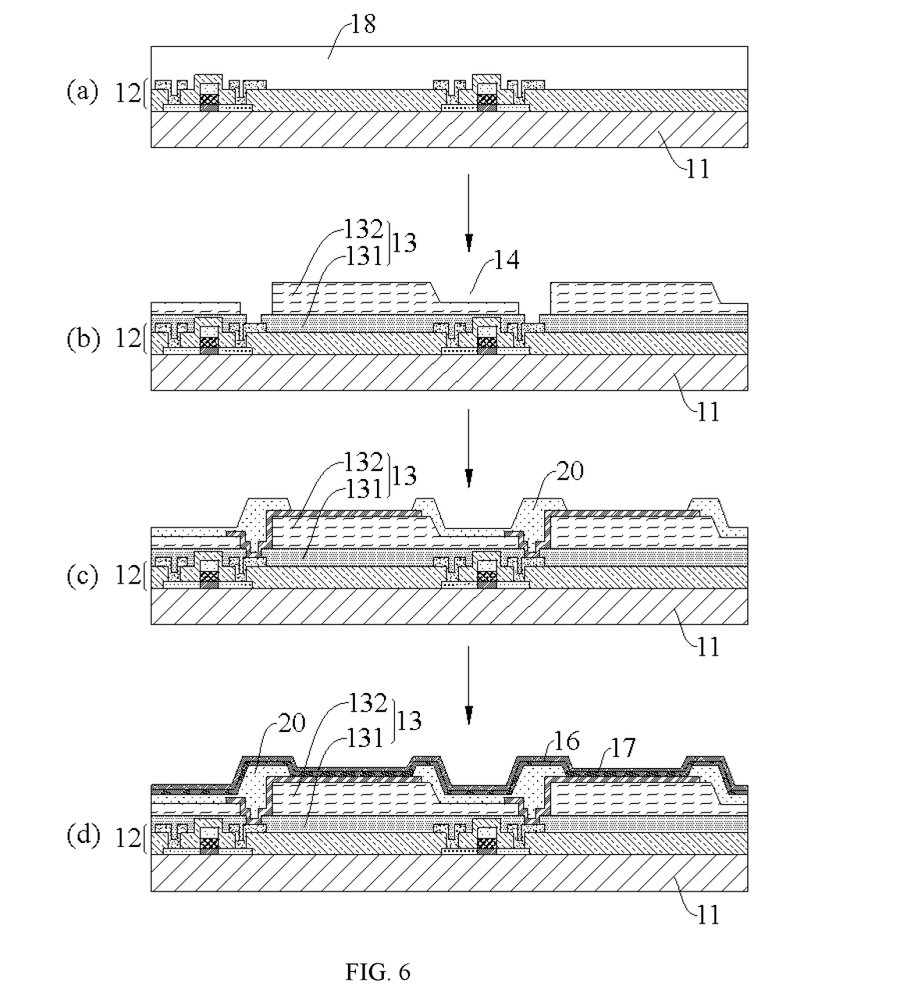
FIG. 6 is a schematic flowchart of a method for preparing a display substrate according to an embodiment of the present disclosure.

Specifically, in this step, referring to FIG. 6, forming a display substrate may comprise: (a) sequentially forming a circuit structure layer 12 and an insulating material layer 18 on the first substrate 11; (b) patterning the insulating material layer 18 to form an insulating layer 13 comprising at least one groove 14, the insulating layer 13 comprising a passivation layer 131 and a first flat layer 132; (c) sequentially forming an anode 15 and a pixel defining layer 20 on a side of the insulating layer 13 away from the first substrate 11; (d) sequentially forming a light-emitting layer 16 and a cathode 17 on a side of the pixel defining layer 20 away from the first substrate 11. In some embodiments, a part of the pixel defining layer 20 and a part of the cathode 17 are stacked on the inner wall of the groove 14 to form the recess 30. In an alternative embodiment, a part of the pixel defining layer 20, a part of the light-emitting layer 16 and a part of the cathode 17 are stacked on the inner wall of the groove 14 to form the recess 30.

Specifically, the specific formation method of each layer structure in the circuit structure layer 12 is not particularly limited, and it can be specifically selected according to needs. For example, the entire insulating layer 13, the light-emitting layer 16, and the cathode 17 can be directly formed by vapor deposition (specifically, physical vapor deposition (vacuum evaporation, magnetron sputtering, etc.), chemical vapor deposition, etc.). The patterned active layer, gate electrode, gate insulating layer, source and drain electrodes, anode, and pixel defining layer can be first formed into a whole layer structure by vapor deposition method, and then patterned by etching with a mask.

S20: forming a color filter substrate comprising at least one spacer, the at least one spacer corresponding to the at least one recess in a one-to-one correspondence.

Figure 7:
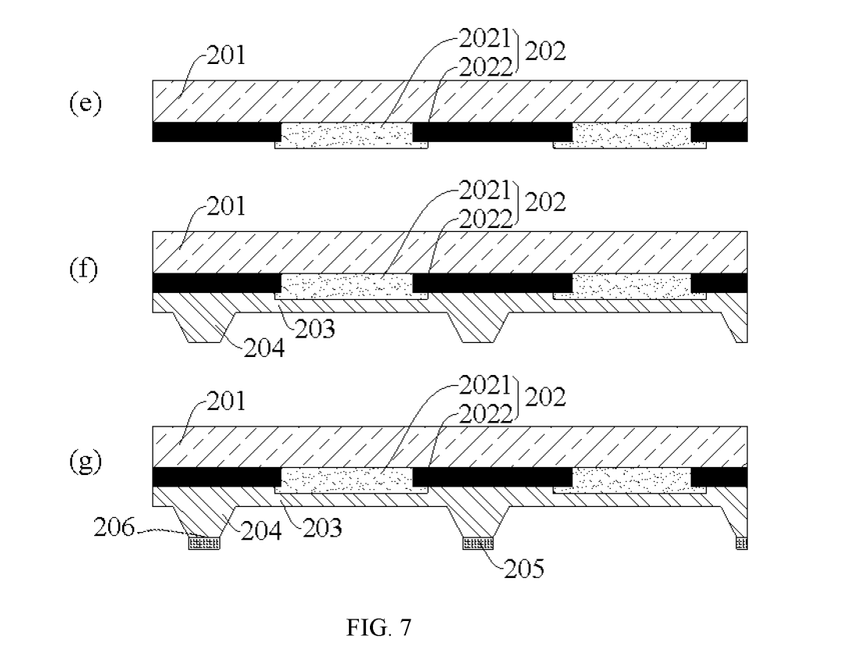
FIG. 7 is a schematic flowchart of a method for preparing a color filter substrate according to an embodiment of the present disclosure.

Specifically, in this step, referring to FIG. 7, forming a color filter substrate may comprise: (e) forming a filter layer 202 on the second substrate 201; (f) applying a flat layer on a side of the filter layer 202 away from the second substrate 201, and patterning the flat layer to form a second flat layer 203 and the spacer 204 at the same time.

Specifically, forming the filter layer 202 may comprise the steps of forming a color filter 2021 and a black matrix 2022. Specifically, the black matrix 2022 and the color filter 2021 can be successively deposited on the second substrate 201. When the color filter 2021 is prepared, red, green, and blue filters are successively deposited, and the color filter 2021 covers a part of the black matrix 2022.

In some embodiments, referring to FIG. 7, forming the color filter substrate 202 may further comprise: (g) forming an auxiliary electrode 205 at a protruding end 206 on a side of the spacer 204 away from the second substrate 201. Specifically, a metal layer can be deposited and patterned to form the auxiliary electrode 205.

S30: assembling the display substrate and the color filter substrate so as to make at least a part of each spacer 204 to be received in a corresponding recess 30.

In this step, the specific assembling process can be performed with reference to conventional techniques, and the spacer 204 and the recess 30 can be aligned during positioning and alignment.

In a specific embodiment, the display device can be prepared by the following steps:
(1) cleaning the second substrate 201, and successively depositing the black matrix 2022 and the color filter layer 2021 on the second substrate 201. When the color filter layer 2021 is prepared, the red, green and blue filters are successively deposited, and the color filter 2021 covers a part of the black matrix 2022;
(2) integrally forming the second flat layer 203 and the spacer 204. Specifically, an entire layer structure can be deposited and then patterned to form the second flat layer 203 and the spacer 204;
(3) depositing a metal layer on a side of the spacer 204 away from the second substrate 201, and patterning the metal layer to form the auxiliary electrode 205, as illustrated in FIG. 7(g);
(4) forming an active layer pattern on the first substrate 101 after initial cleaning of the first substrate 101;
(5) successively depositing a gate insulating layer and a gate layer, and using a mask to form the gate electrode 123 and the gate insulating layer 122 by dry etching using a self-aligned process, and when the gate insulating layer 122 is dry-etched, performing over-etching to realize the conductorization of the active layer;
(6) depositing the interlayer insulating layer and forming via holes;
(7) depositing and patterning source and drain metals;
(8) depositing and patterning a passivation layer and a first flat layer, and forming a groove 14 in the first flat layer 132;
(9) depositing and patterning the anode, and depositing and patterning the pixel defining layer;
(10) evaporating the light-emitting layer and cathode;
(11) assembling the display substrate and the color filter substrate.

The method is simple to operate, easy to control, high compatibility with existing equipment. The resulted display device has a thinner thickness, hence the distance between the light-emitting element and the light-emitting surface of the display device is short, and hence the light-emitting element has a short light-emitting distance, an improved light-emitting efficiency, and a long lifetime.

In the description of the embodiments of the present disclosure, it should be understood that the terms "first" and "second" are only used for descriptive purposes, which cannot be understood as indicating or implying relative importance or implicitly indicating the number of indicated technical features. Thus, the features defined with "first" and "second" may explicitly or implicitly include one or more of these features. In the description of the embodiments of the present disclosure, the term "a plurality of" means two or more than two, unless otherwise specifically defined.

In the description of this specification, descriptions with reference to the terms "one embodiment", "some embodiments", "examples", "specific examples", or "some examples" etc. mean specific features, structures, materials, or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, those skilled in the art can combine different embodiments or examples and the features of different embodiments or examples described in this specification without contradicting each other.

Although the embodiments of the present disclosure have been illustrated and described above, it can be understood that the above embodiments are exemplary and should not be construed as limiting the present disclosure. Those of ordinary skill in the art can make changes, modifications, substitutions and variations to the above-mentioned embodiments within the scope of the present disclosure, and these changes, modifications, substitutions and variations should all be covered by the protection scope of the present disclosure. Therefore, the protection scope of the present disclosure should be subject to the protection scope of the claims.

The invention claimed is:

1. A display substrate comprising:
a first substrate;
a pixel defining layer on the first substrate and comprising a plurality of sub-pixel openings;
an insulating layer between the first substrate and the pixel defining layer and comprising a groove;
a circuit structure layer between the first substrate and the insulating layer; and
at least one recess on a side of the display substrate away from the first substrate,
wherein an orthographic projection of the at least one recess on the first substrate and orthographic projections of the plurality of sub-pixel openings on the first substrate do not overlap,
wherein the insulating layer comprises a passivation layer and a first flat layer that are stacked, the passivation layer is between the circuit structure layer and the first flat layer, and
wherein a bottom of the groove is in the first flat layer, or the bottom of the groove is at an interface between the first flat layer and the passivation layer, or the bottom of the groove is in the passivation layer and does not penetrate the passivation layer.

2. The display substrate according to claim 1, further comprising:
a light-emitting layer on a side of the pixel defining layer away from the first substrate and at least in the plurality of sub-pixel openings; and
a cathode on a side of the light-emitting layer away from the first substrate, and covering a surface of the light-emitting layer away from the first substrate and a surface of the pixel defining layer away from the first substrate and not covered by the light-emitting layer,
wherein at least a part of the pixel defining layer and a part of the cathode are stacked in the groove to form the recess.

3. The display substrate according to claim 2, wherein a part of the pixel defining layer, a part of the light-emitting layer, and a part of the cathode are stacked in the groove to form the recess.

4. The display substrate according to claim 2, further comprising:
an anode between the insulating layer and the light-emitting layer and in at least one of the plurality of sub-pixel openings.

5. The display substrate according to claim 4, wherein the anode is electrically connected to a thin film transistor in the circuit structure layer through a via hole penetrating the groove.

6. The display substrate according to claim 5, wherein the anode covers a part of the bottom of the groove.

7. The display substrate according to claim 4, wherein an orthographic projection of the recess on the first substrate and an orthographic projection of a thin film transistor in the circuit structure layer on the first substrate at least partially overlap.

8. The display substrate according to claim 1, wherein the display substrate comprises a plurality of recesses, and the plurality of recesses are approximately uniformly distributed on the display substrate.

9. The display substrate according to claim 8, wherein one recess is arranged between every 1-8 sub-pixel openings.

10. A display device comprising:
the display substrate according to claim 1; and
a color filter substrate opposite to the display substrate, the color filter substrate comprising at least one spacer protruding toward the display substrate,
wherein the at least one spacer corresponds to the at least one recess in a one-to-one correspondence, and at least a part of one of the at least one spacer is received in a corresponding one of the at least one recess.

11. The display device according to claim 10, wherein the color filter substrate further comprises an auxiliary electrode between a protruding end of the spacer and the recess, and the auxiliary electrode is electrically connected to a cathode of the display substrate.

12. The display device according to claim 11, wherein a distance between the auxiliary electrode and the first substrate is a first distance, a distance between a portion of a light-emitting layer of the display substrate in the sub-pixel openings and the first substrate is a second distance, and the first distance is smaller than the second distance.

13. The display device according to claim 11, wherein a material of the auxiliary electrode is at least one selected from a group consisting of Mo, Al, Ti, Au, Cu, Hf, Ta, Nd or alloys thereof.

14. The display device according to claim 10, wherein the color filter substrate further comprises:
a second substrate;
a filter layer on the second substrate; and
a second flat layer on a side of the filter layer away from the second substrate,
wherein the spacer is on a side of the second flat layer away from the second substrate and is integrally formed with the second flat layer.

15. The display device according to claim 14, wherein a material of the second flat layer and the spacer is at least one selected from a group consisting of resin, spin on glass, and benzocyclobutene.

16. A method for manufacturing the display device according to claim 10, comprising:
forming the display substrate comprising the at least one recess;
forming the color filter substrate comprising the at least one spacer, the at least one spacer corresponding to the at least one recess in a one-to-one correspondence; and
assembling the display substrate and the color filter substrate to make at least a part of one of the at least one spacer to be received in a corresponding one of the at least one recess.

17. The method according to claim 16, wherein the forming the display substrate comprises:
sequentially forming a circuit structure layer and an insulating material layer on the first substrate;
patterning the insulating material layer to form an insulating layer comprising the groove; and
sequentially forming an anode, a pixel defining layer, a light-emitting layer, and a cathode on a side of the insulating layer away from the first substrate, so that at least a part of the pixel defining layer and a part of the cathode are stacked in the groove to form the recess.

18. The method according to claim 16, wherein the forming the color filter substrate comprises:
forming a filter layer on a second substrate; and
applying a flat layer on a side of the filter layer away from the second substrate, and patterning the flat layer to simultaneously form a second flat layer and the spacer.

19. The method according to claim 18, wherein the forming the color filter substrate further comprises:
forming an auxiliary electrode at a protruding end of the spacer on a side away from the second substrate.

* * * * *